United States Patent
Pezeshki et al.

(10) Patent No.: US 12,271,046 B2
(45) Date of Patent: Apr. 8, 2025

(54) OPTICAL INTERCONNECTS USING MICROLEDS

(71) Applicant: AVICENATECH CORP., Sunnyvale, CA (US)

(72) Inventors: Bardia Pezeshki, Sunnyvale, CA (US); Robert Kalman, Sunnyvale, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 0 days.

(21) Appl. No.: 18/118,462

(22) Filed: Mar. 7, 2023

(65) Prior Publication Data

US 2023/0280557 A1    Sep. 7, 2023

Related U.S. Application Data

(63) Continuation of application No. 17/020,643, filed on Sep. 14, 2020, now Pat. No. 11,624,882.

(Continued)

(51) Int. Cl.
*G02B 6/12* (2006.01)
*G02B 6/42* (2006.01)
(Continued)

(52) U.S. Cl.
CPC ............ *G02B 6/43* (2013.01); *G02B 6/12004* (2013.01); *G02B 6/4246* (2013.01);
(Continued)

(58) Field of Classification Search
CPC ............ G02B 6/12; G02B 6/42; H01L 31/167
(Continued)

(56) References Cited

U.S. PATENT DOCUMENTS

| 4,422,088 A * | 12/1983 | Gfeller ............ G02B 6/42 385/16 |
| 5,237,441 A * | 8/1993 | Nhu ............ H04B 10/40 398/139 |

(Continued)

FOREIGN PATENT DOCUMENTS

| CN | 1578948 A | 2/2005 |
| JP | 2011-014932 A | 1/2011 |
| WO | WO 2003/021455 | 3/2003 |

OTHER PUBLICATIONS

Office Action on related CN Application No. 202080069624.2 from China National Intellectual Property Administration (CNIPA) dated Nov. 30, 2023.

(Continued)

*Primary Examiner* — Kaveh C Kianni

(57) ABSTRACT

MicroLEDs may be used in providing intra-chip optical communications and/or inter-chip optical communications, for example within a multi-chip module or semiconductor package containing multiple integrated circuit semiconductor chips. In some embodiments the integrated circuit semiconductor chips may be distributed across different shelves in a rack. The optical interconnections may make use of optical couplings, for example in the form of lens(es) and/or mirrors. In some embodiments arrays of microLEDs and arrays of photodetectors are used in providing parallel links, which in some embodiments are duplex links.

11 Claims, 14 Drawing Sheets

Related U.S. Application Data

(60) Provisional application No. 62/900,383, filed on Sep. 13, 2019.

(51) Int. Cl.
  *G02B 6/43* (2006.01)
  *H01L 31/167* (2006.01)
  *H04B 10/80* (2013.01)

(52) U.S. Cl.
  CPC ......... *H01L 31/167* (2013.01); *H04B 10/801* (2013.01); *G02B 2006/12102* (2013.01); *G02B 2006/12104* (2013.01)

(58) Field of Classification Search
  USPC .......................................................... 385/14
  See application file for complete search history.

(56) References Cited

U.S. PATENT DOCUMENTS

| | | | |
|---|---|---|---|
| 5,335,361 A | 8/1994 | Ghaem | |
| 5,638,469 A | 6/1997 | Feldman | |
| 5,848,214 A | 12/1998 | Haas | |
| 6,203,262 B1* | 3/2001 | Frich | B65G 65/00 |
| | | | 414/331.11 |
| 6,487,358 B1* | 11/2002 | Gehrke | G02B 6/44524 |
| | | | 385/136 |
| 6,669,801 B2 | 12/2003 | Yoshimura | |
| 6,970,491 B2 | 11/2005 | Bhandarkar | |
| 7,393,145 B1 | 7/2008 | Stevens | |
| 7,459,726 B2 | 12/2008 | Kato | |
| 7,915,699 B2 | 3/2011 | Krishnamoorthy | |
| 8,086,108 B2* | 12/2011 | Tanigawa | H04J 14/06 |
| | | | 398/128 |
| 8,148,202 B2 | 4/2012 | Krishnamoorthy | |
| 8,153,957 B2 | 4/2012 | Feldman | |
| 9,160,450 B2* | 10/2015 | Duis | H04B 10/40 |
| 10,610,087 B2* | 4/2020 | Hu | A61B 1/042 |
| 10,840,418 B1* | 11/2020 | Massoubre | G03F 7/7005 |
| 11,460,723 B1* | 10/2022 | Jiang | H01L 27/156 |
| 11,515,356 B2* | 11/2022 | Pezeshki | H01L 31/0203 |
| 11,579,171 B1* | 2/2023 | Percival | G02B 27/0172 |
| 2002/0041731 A1* | 4/2002 | Fujita | G02B 6/4246 |
| | | | 385/24 |
| 2002/0097962 A1* | 7/2002 | Yoshimura | G02B 6/124 |
| | | | 385/16 |
| 2003/0031414 A1* | 2/2003 | Inui | G02B 6/29362 |
| | | | 385/39 |
| 2003/0223683 A1* | 12/2003 | Bennett | H01S 3/06704 |
| | | | 385/24 |
| 2004/0001717 A1* | 1/2004 | Bennett | H04B 10/807 |
| | | | 398/92 |
| 2004/0028323 A1* | 2/2004 | Bennett | H04J 14/0201 |
| | | | 385/24 |
| 2004/0067006 A1* | 4/2004 | Welch | H01S 5/4031 |
| | | | 385/14 |
| 2004/0126053 A1* | 7/2004 | Ouchi | G02B 6/12004 |
| | | | 385/14 |
| 2004/0159777 A1 | 8/2004 | Stone | |
| 2005/0046011 A1* | 3/2005 | Chen | H05K 1/0274 |
| | | | 257/705 |
| 2006/0127022 A1 | 6/2006 | Kim | |
| 2007/0036493 A1 | 2/2007 | Brenner | |
| 2008/0273019 A1* | 11/2008 | Deane | G06F 3/0421 |
| | | | 385/14 |
| 2009/0028563 A1* | 1/2009 | Tanigawa | H04J 14/06 |
| | | | 257/E31.095 |
| 2009/0060529 A1* | 3/2009 | Beranek | H01S 5/0683 |
| | | | 398/197 |
| 2010/0097600 A1* | 4/2010 | Barenek | G01M 11/35 |
| | | | 356/73.1 |
| 2010/0171023 A1* | 7/2010 | Asahi | G02B 6/4214 |
| | | | 250/227.11 |
| 2010/0327195 A1* | 12/2010 | Huang | H04B 10/802 |
| | | | 250/551 |
| 2012/0020663 A1* | 1/2012 | McLaren | G02B 6/2852 |
| | | | 398/48 |
| 2013/0004119 A1* | 1/2013 | Yin | G02B 6/42 |
| | | | 385/14 |
| 2013/0230280 A1 | 9/2013 | Kadar-Kallen | |
| 2014/0177995 A1* | 6/2014 | Mohammed | G02B 6/4214 |
| | | | 385/79 |
| 2015/0241645 A1 | 8/2015 | Khalid | |
| 2015/0301285 A1* | 10/2015 | Lewallen | G02B 6/4292 |
| | | | 385/60 |
| 2015/0333831 A1* | 11/2015 | Lai | G02B 6/428 |
| | | | 250/208.2 |
| 2015/0341119 A1* | 11/2015 | Fincato | H05K 3/30 |
| | | | 398/139 |
| 2016/0020353 A1* | 1/2016 | Chu | H01L 24/97 |
| | | | 257/21 |
| 2016/0172020 A1 | 6/2016 | Baker | |
| 2016/0233269 A1 | 8/2016 | Choi | |
| 2016/0327737 A1* | 11/2016 | Zhang | H01L 31/12 |
| 2017/0018688 A1* | 1/2017 | Mazed | H01L 27/14621 |
| 2017/0084804 A1 | 3/2017 | Chen | |
| 2017/0184450 A1* | 6/2017 | Doylend | G01S 7/4817 |
| 2017/0276874 A1 | 9/2017 | Kashyap | |
| 2017/0309798 A1 | 10/2017 | Bonar | |
| 2017/0336565 A1* | 11/2017 | Ryckman | G02B 6/136 |
| 2018/0109067 A1 | 4/2018 | Yaman | |
| 2018/0239096 A1 | 8/2018 | Houbertz | |
| 2018/0269191 A1 | 9/2018 | England | |
| 2018/0335589 A1* | 11/2018 | Jou | G02B 6/4259 |
| 2019/0011652 A1 | 1/2019 | Chang | |
| 2019/0049367 A1 | 2/2019 | Zou | |
| 2019/0058242 A1* | 2/2019 | Tabe | H01Q 1/248 |
| 2019/0165209 A1* | 5/2019 | Bonar | H01L 33/46 |
| 2019/0189603 A1 | 6/2019 | Wang | |
| 2020/0111259 A1* | 4/2020 | Sears | G02B 27/0172 |
| 2021/0097943 A1* | 4/2021 | Wyatt | H10K 59/352 |
| 2022/0011528 A1* | 1/2022 | Fujimura | G02B 6/4212 |
| 2022/0342219 A1* | 10/2022 | Sung | G02B 6/1221 |

OTHER PUBLICATIONS

Bhatnagar, et al., Pump-Probe Measurements of CMOS Detector Rise Time in the Blue, Journal of Lightwave Technology, vol. 22, No. 9, Sep. 2004, pp. 2213-2217.

Lars Brusberg et al., Optoelectronic Glass Substrate for Co-packaged Optics and ASICs, Optical Fiber Communication Conference, Mar. 12, 2020, San Diego, CA, pp. 1-24.

J. F. C. Carreira et al., Direct integration of micro-LEDs and a SPAD detector on a silicon CMOS chip for data communications and time-of-flight ranging, Optics Express, vol. 28, No. 5, Mar. 2, 2020, pp. 6909-6917.

Brian Corbett et al., Chapter Three—Transfer Printing for Silicon Photonics, Semiconductors and Semimetals, vol. 99, 2018, ISSN 0080-8784, pp. 43-70, https://doi.org/10.1016/bs.semsem.2018.08.001.

Roger Dangel et al., Polymer Waveguides Enabling Scalable Low-Loss Adiabatic Optical Coupling for Silicon Photonics, IEEE Journal of Selected Topics In Quantum Electronics, vol. 24, No. 4, Jul./Aug. 2018, 11 pages.

Martin D. Dawson, Micro-LEDs for Technological Convergence between Displays, Optical Communications, & Sensing and Imaging Systems, SID Display Week 2020, Session 44, Invited paper No. 44.1, 27 pages.

Lee, et al., Low-Cost and Robust 1-Gbit/s Plastic Optical Fiber Link Based on Light-Emitting Diode Technology, Optical Society of America, 2008.

Lei Liu et al., On-chip optical interconnect on silicon by transfer printing, In: CLEO: Science and Innovations 2018, San Jose, California, USA, May 13-18, 2018, pp. 1-2.

David A. B. Miller, Optical Interconnects, IAA Workshop, Jul. 22, 2008, pp. 1-26.

Bing Wang et al., On-chip Optical Interconnects using InGaN Light-Emitting Diodes Integrated with Si-CMOS, In: Aais Communications and Photonics Conference 2014, Shanghai, China, Nov. 11-14, 2014, pp. 1-3.

(56) References Cited

OTHER PUBLICATIONS

Yurii Vlasov, Silicon photonics for next generation computing systems, Tutorial given at the European Conference on Optical Communications, Sep. 22, 2008.
Yahav, et al., Multi-Gigabit Spatial-Division Multiplexing Transmission Over Multicore Plastic Optical Fiber, Journal of Lightwave Technology, vol. 39, No. 8, Apr. 15, 2021, pp. 2296-2304.
Ziyang Zhang et al., Hybrid Photonic Integration on a Polymer Platform, Photonics 2015, 2, pp. 1005-1026.
International Search Report on related PCT Application No. PCT/US2020/039968 from International Searching Authority (KIPO) dated Oct. 12, 2020.
Written Opinion on related PCT Application No. PCT/US2020/039968 from International Searching Authority (KIPO) dated Oct. 12, 2020.
International Search Report on related PCT Application No. PCT/US2020/050766 from International Searching Authority (KIPO) dated Dec. 29, 2020.
Written Opinion on related PCT Application No. PCT/US2020/050766 from International Searching Authority (KIPO) dated Dec. 29, 2020.
Extended European Search Report dated Oct. 10, 2022 issued in corresponding EP Appln. No. 20863717.3.
Office Action on related CN Application No. 202080069624.2 from China National Intellectual Property Administration (CNIPA) dated May 11, 2024.

* cited by examiner

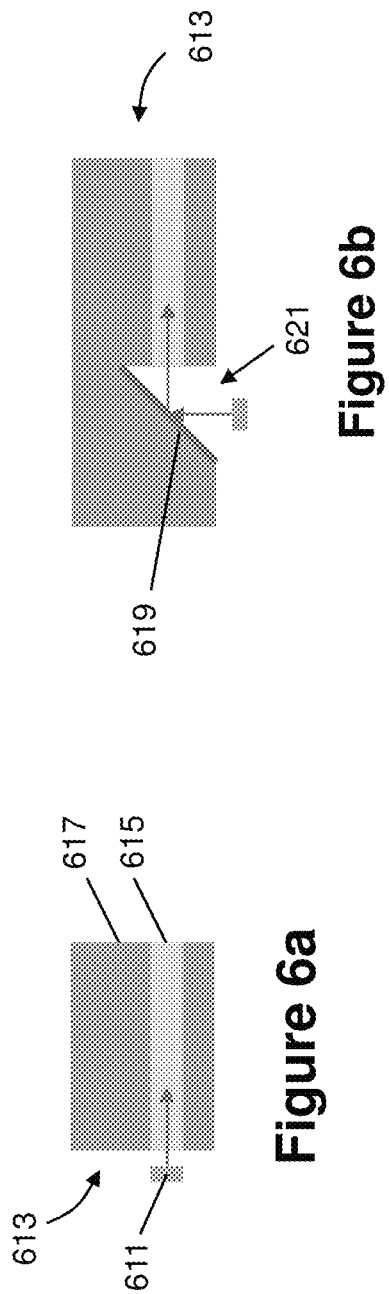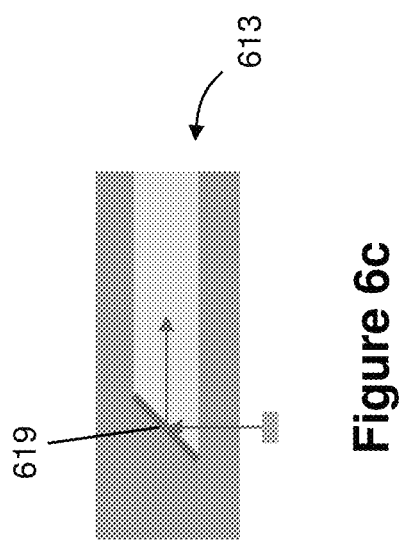
Figure 6a
Figure 6b
Figure 6c

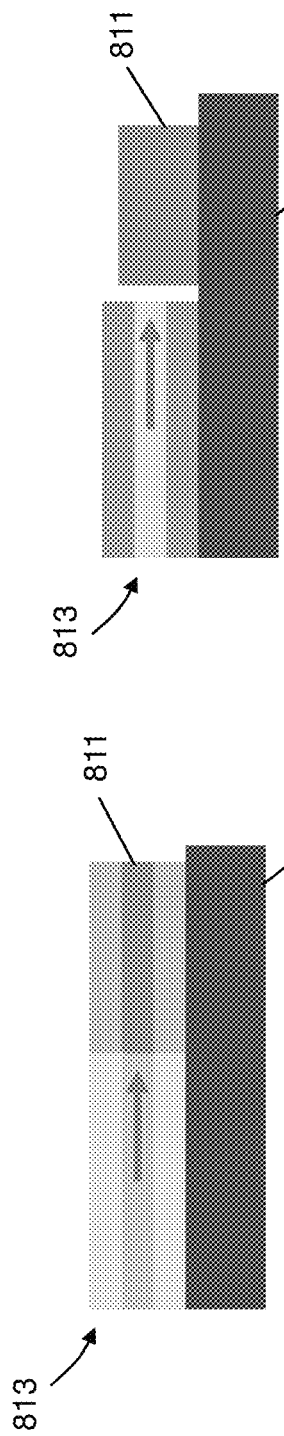
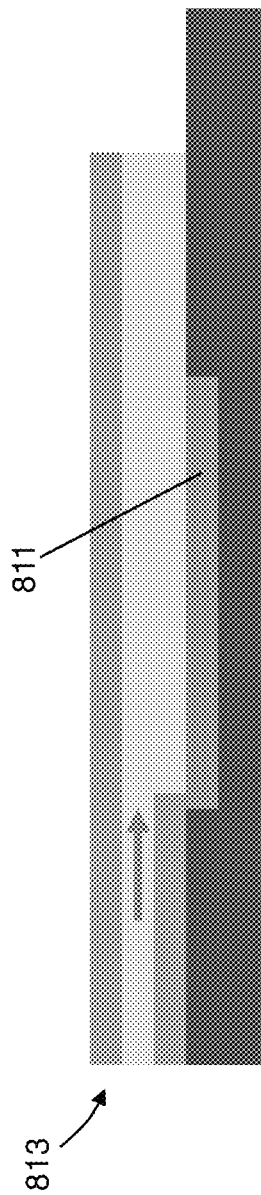
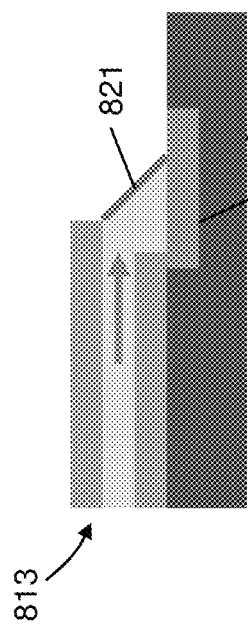
Figure 8a
Figure 8b
Figure 8c
Figure 8d

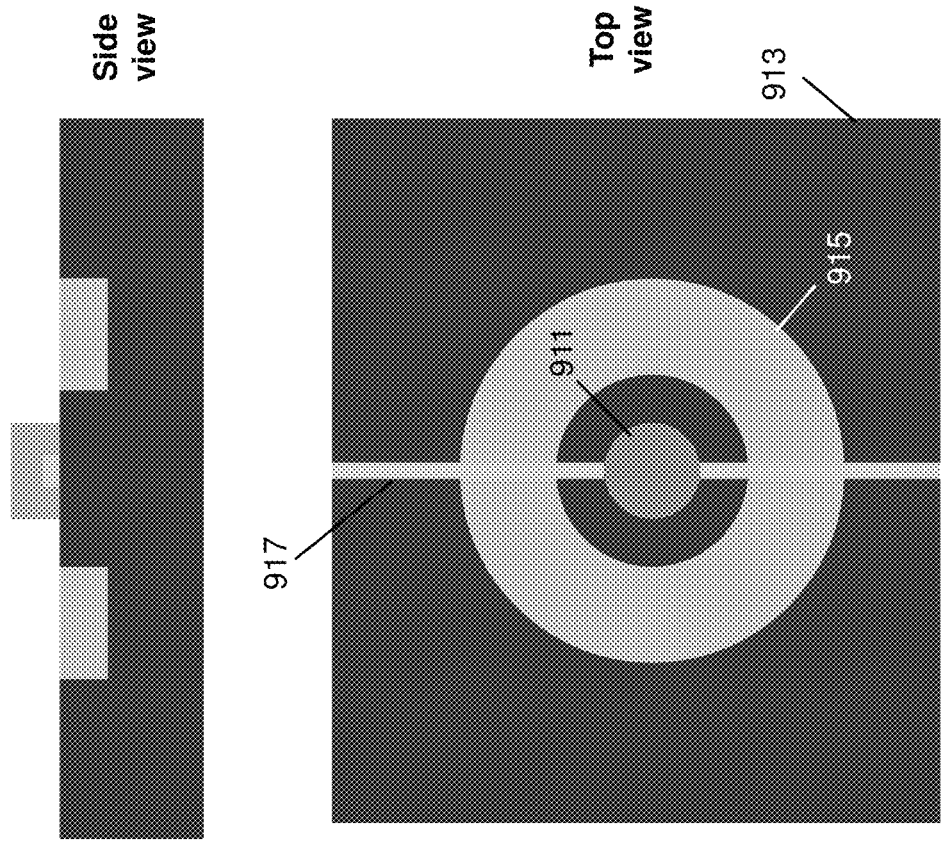
Figure 9c
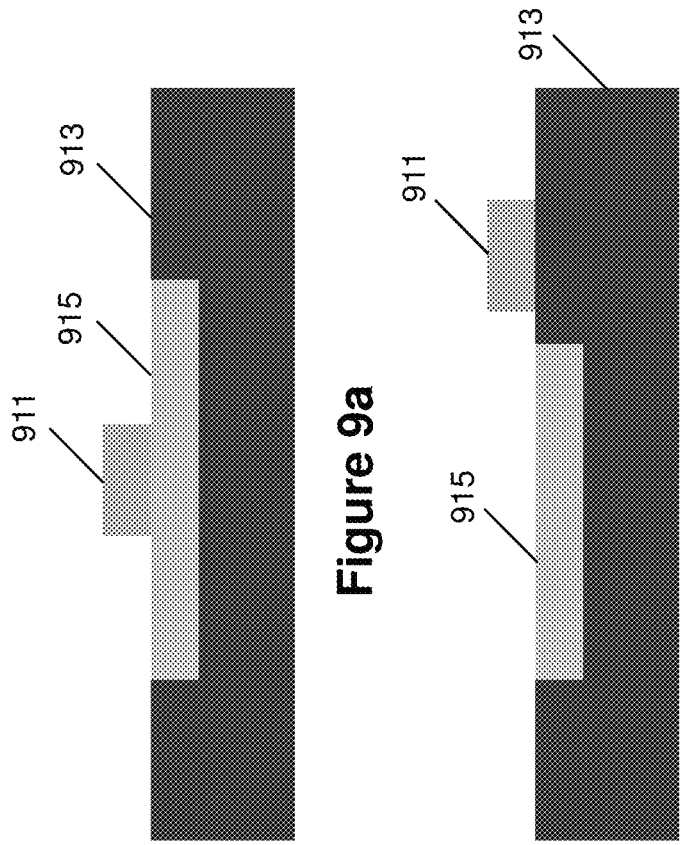
Figure 9a
Figure 9b

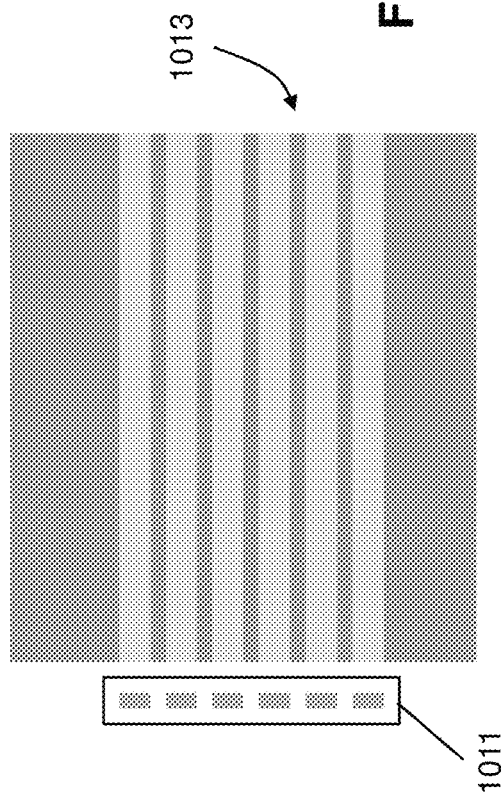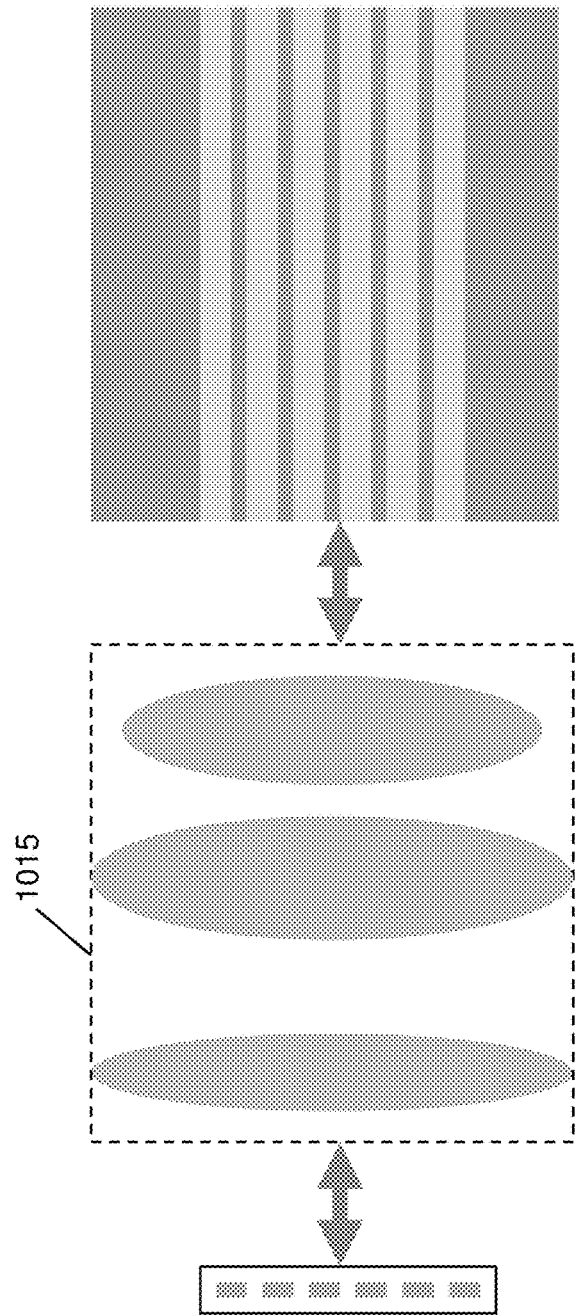

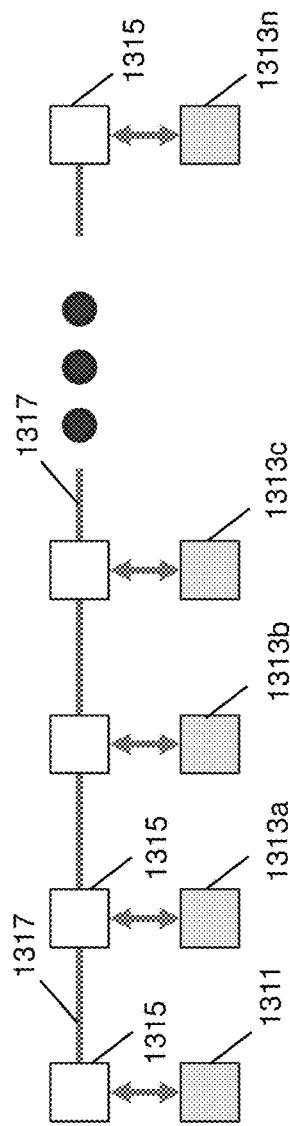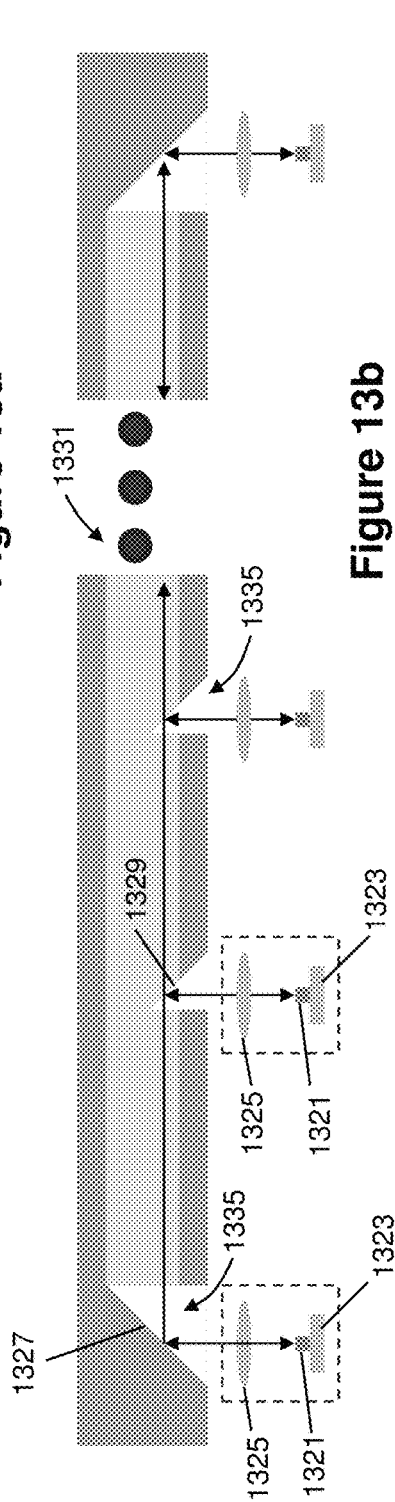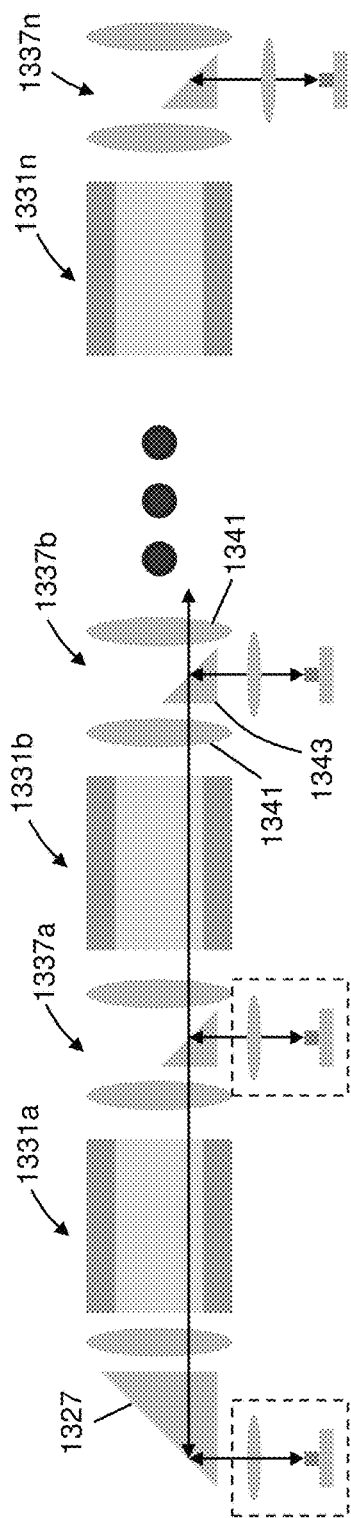
Figure 13a
Figure 13b
Figure 13c

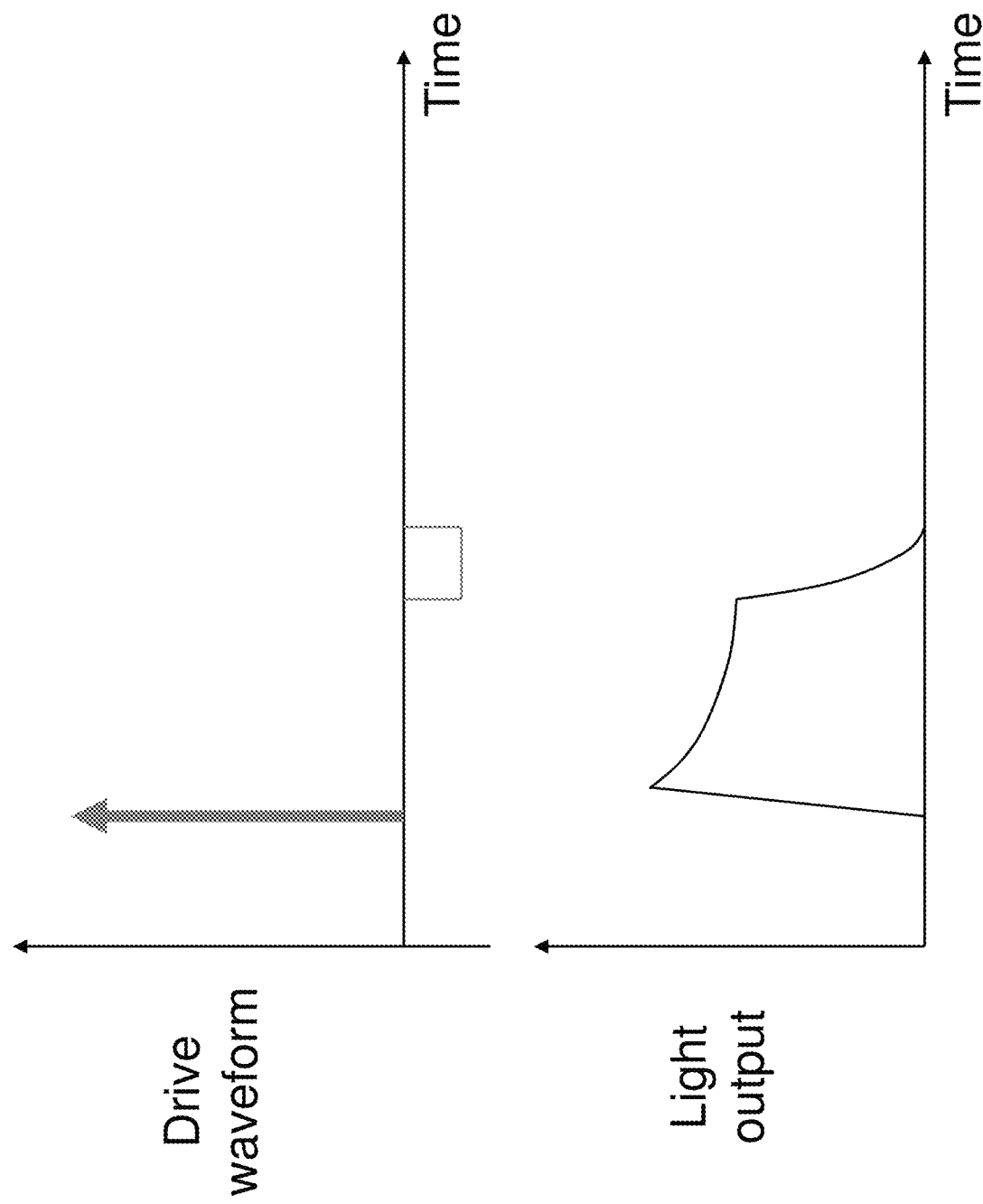

OPTICAL INTERCONNECTS USING MICROLEDS

CROSS REFERENCE TO RELATED APPLICATIONS

This application is a continuation of U.S. patent application Ser. No. 17/020,643, filed on Sep. 14, 2020, which claims the benefit of the filing date of U.S. Provisional Patent Application No. 62/900,383 filed on Sep. 13, 2019, the disclosures of each of which are incorporated by reference herein.

BACKGROUND OF THE INVENTION

The present invention relates generally to optical communications, and more particularly to microLED-based inter- and intra-chip optical communication interconnections.

Desires for high-performance computing and networking is ubiquitous with ever-increasing speed and density requirements. Prominent applications include data center servers, high-performance computing clusters, artificial neural networks, and network switches. For decades, dramatic integrated circuit (IC) performance and cost improvements were driven by shrinking transistor dimensions combined with increasing die sizes, summarized in the famous Moore's Law. Transistor counts in the billions have allowed consolidation onto a single system-on-a-chip (SoC) of functionality that was previously fragmented across multiple ICs.

However, data communication within large IC chips may result in increased power usage and complexity, particularly for chips operated at higher clock rates. Moreover, IC chips may be co-packaged within a single module, and communications between those IC chips may further increase power demands and complexity.

The use of optical links for communications between local chips may reduce power usage, in theory. Lasers, for example, have long been used for long range fiber optic communications. However, lasers (including edge-emitting lasers and vertical cavity surface-emitting lasers (VCSELs)) typically require high drive power, are relatively large, and work poorly at the high temperatures encountered in intra-chip and inter-chip interconnects.

BRIEF SUMMARY OF THE INVENTION

Aspects of some embodiments utilize advances in unrelated fields of optical devices for displays for breaking the technological barriers in short distance data communications and providing for implementation of devices that can form short distance data connections that are potentially fast, low power, dense, and low cost. This can be used to implement data connections between ICs within a module, or to implement data connections between modules at distances up to several meters. In some embodiments the optical connections, which may be termed optical interconnects, use one or more microLEDs to generate light used to transfer information from one component to another component, or from an area within one component to a different area within the same component. In some embodiments the information is transferred from one chip within a multi-chip module to another chip within the multi-chip module. In some embodiments the information is transferred from one area of a chip to another area of the same chip. In some embodiments the information is transferred over a transmission medium of an interposer or other substrate, for example for information transfer within a chip or within a multi-chip module, or for example to which the chips are coupled or mounted.

In some embodiments, optical communication is provided between two semiconductor chips by a parallel microLED interconnect (PMI), where the PMI comprises an array or arrays of transmitters and receivers connected by a propagation medium. In some embodiments a transmitter comprises transmitter circuitry, a microLED, and transmitter light collection optics. In some embodiments a receiver comprises receiver light collection optics, a photodetector, and receiver circuitry. In some embodiments the two ICs are within a same package. In some embodiments the two ICs are coupled to a same package substrate. In some embodiments, the two ICs are in different modules. In some embodiments, the modules being interconnected are in different shelves. In some embodiments, the shelves being interconnected are within the same rack. In some embodiments the shelves being interconnected are within different racks. In some embodiments, a PMI connects two different areas that are on the same IC.

In some embodiments, the propagation medium comprises one or more layers of waveguides on a planar substrate. In some embodiments, the propagation medium is a multicore fiber; in some further embodiments, the multicore fiber is a coherent fiber bundle (CFB).

In some embodiments, a microLED is butt-coupled to an endface of a waveguide. In some embodiments, a microLED is coupled to an endface of a waveguide or fiber by transmitter light collection optics. In some embodiments, transmitter light collection optics comprise a lens and/or a reflecting collector. In some embodiments, a microLED is coupled to a waveguide via a turning mirror fabricated in the waveguide. In some embodiments, a microLED is coupled to a waveguide via a grating coupler. In some embodiments, a microLED is coupled to a waveguide via an intermediate slab waveguide.

In some embodiments, a waveguide endface is butt-coupled to a photodetector (PD). In some embodiments, a waveguide or fiber is coupled to a PD by receiver light collection optics. In some embodiments, receiver light collection optics comprise a lens and/or a reflecting collector. In some embodiments, a waveguide on a substrate is in contact with the substrate region containing a photodetector and the light is absorbed by the photodetector along the waveguide length. In some embodiments, a right angle turning mirror at the end of a waveguide causes light in the waveguide to be reflected onto a photodetector fabricated in the substrate on which the waveguide is fabricated.

In some embodiments, the propagation medium in a PMI comprises one or more layers of planar waveguides. In some embodiments, the propagation medium comprises a multi-core fiber or a coherent fiber bundle. In some embodiments, the propagation medium comprises a free-space region that may contain lenses, mirrors, holographic optical elements, or other optical components.

In some embodiments, an array of transmitters and receivers is coupled to a propagation medium by a lens assembly. In some embodiments, an array of transmitters and receivers is coupled to a propagation medium by two lens assemblies between which a turning mirror is inserted. In some embodiments, the lens assemblies comprise micromachined silicon "MEMS" structures that hold one or more microlenses.

In some embodiments, an optical bus comprises an array of tapped bus links; each tapped bus link comprises a master node with a transmitter and receiver that is located on one end of a waveguide, and optical taps are located on along the length of the waveguide, with a slave node with a transmitter and receiver optically coupled to each tap. In some embodiments, each tap on an optical bus comprises a turning mirror subtending part of the cross-section of a waveguide. In some embodiments, each tap on an optical bus comprises a turning mirror located between two lenses, where the turning mirror subtends part of the beam transiting between the two lenses.

In some embodiments, the drive circuit for a microLED comprises circuitry configured to cause a sharp spike to drive the microLED at the rising edge of each pulse at the input to the drive circuitry, and the circuitry causes the microLED to be reverse-biased at the falling edge of each input pulse to the drive circuitry.

Some embodiments provide an inter- or intra-chip optical communication system, comprising: a waveguide; a first photodetector electrically coupled to a first integrated circuit chip and optically coupled to the waveguide; and a first microLED on a portion of the first photodetector, the first microLED electrically coupled to the first integrated circuit chip and optically coupled to the waveguide.

Some embodiments provide an inter-chip optical communication system, comprising: a propagation medium; a first array of optical transceivers electrically coupled to a first integrated circuit chip and optically coupled to a first end of a propagation medium, the first array of optical transceivers including a first plurality of optical transmitters each including transmitter circuitry and a microLED and a first plurality of optical receivers each including a photodetector and receiver circuitry; and a second array of optical transceivers electrically coupled to a second integrated circuit chip, the second integrated circuit chip being in a same package as the first integrated circuit chip, and optically coupled to a second end of the propagation medium, the second array of optical transceivers including a second plurality of optical transmitters each including transmitter circuitry and a microLED and a second plurality of optical receivers each including a photodetector and receiver circuitry.

Some embodiments provide an inter- or intra-chip optical communication system, comprising: a surface emitting microLED electrically coupled to a first integrated circuit chip; a photodetector electrically coupled to a second integrated circuit chip; at least one waveguide; input coupling means for coupling light from the microLED into the at least one waveguide; output coupling means for coupling light from the at least one waveguide onto the photodetector.

These and other aspects of the invention are more fully comprehended upon review of this disclosure.

BRIEF DESCRIPTION OF THE FIGURES

FIGS. 6a-c show various embodiments for coupling one microLED optical assembly (MOA) to one waveguide, in accordance with aspects of the invention.

FIGS. 8a-d show various embodiments for coupling light in a waveguide to a photodetector, in accordance with aspects of the invention.

FIGS. 9a-c illustrate duplex optical assemblies for use in optical links, in accordance with aspects of the invention.

FIGS. 10a and 10b illustrate propagation medium optical coupling schemes for optical transceiver arrays, in accordance with aspects of the invention.

FIGS. 13a-c illustrate optical duplex buses in accordance with aspects of the invention.

FIG. 14 illustrates graphs of drive waveform and light output vs. time for operation of a microLED, in accordance with aspects of the invention.

DETAILED DESCRIPTION

In some embodiments a microLED is made from a p-n junction of a direct-bandgap semiconductor material. In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA.

In some embodiments a microLED is distinguished from a standard LED by (1) having an emitting region of less than 10 μm×10 μm; (2) frequently having cathode and anode contacts on top and bottom surfaces, whereas a standard LED typically has both positive and negative contacts on a single surface; (3) typically being used in large arrays for display and interconnect applications.

MicroLEDs and detectors can be coupled to waveguides either individually or in parallel as arrays. Parallel array connections can either use waveguide arrays or free-space propagation to create the required LED-to-photodetector coupling. These various classes of approaches are described below.

In most cases, the various microLED coupling approaches discussed below can also be used for coupling to photodetectors (but where, of course, light is propagating to a photodetector as opposed to propagating from a microLED). An exception to this source/detector symmetry is the use of waveguide photodetectors; such approaches are discussed in a separate section.

Parallel MicroLED Interconnects

Figure 1:
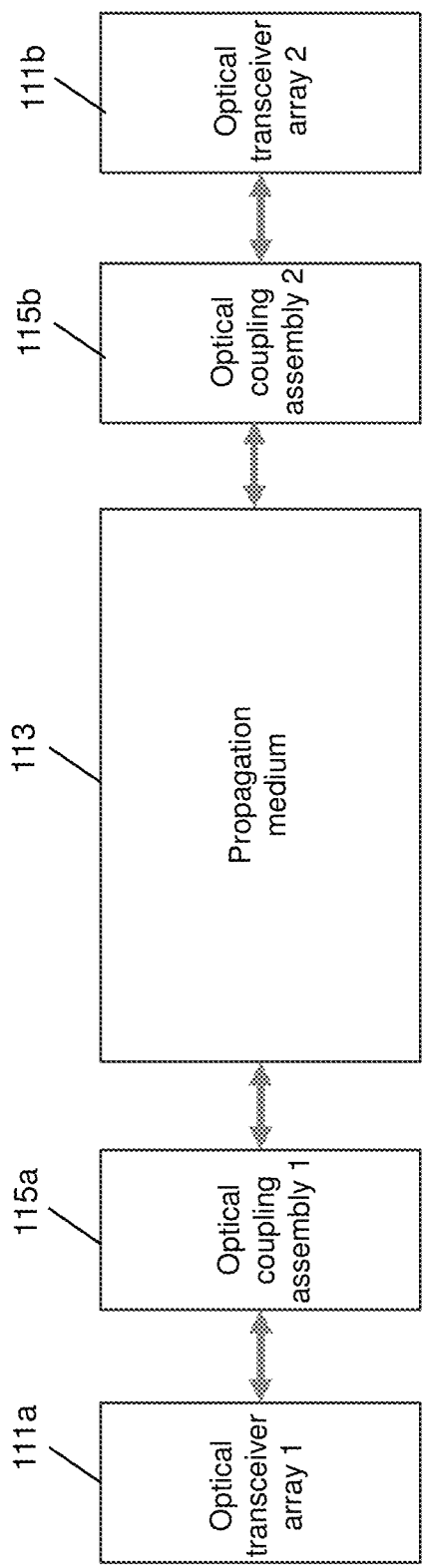
FIG. 1 is a block diagram of a parallel microLED interconnect in accordance with aspects of the invention.

FIG. 1 is a block diagram of a parallel microLED interconnect (PMI). In some embodiments the parallel microLED interconnect (PMI) comprises a first optical transceiver array 111a, a first optical coupling assembly, a propagation medium 113, a second optical coupling assembly, and a second optical transceiver array 111b, with the propagation medium optically connecting between the first optical transceiver array and the second optical transceiver array. The optical transceiver arrays include at least one microLED as a light source, for at least those transceivers that include optical transmitters. In some embodiments the optical transceiver arrays include at least one photodetector, at least for those transceivers that include optical receivers. In some embodiments the first optical transceiver array is electrically coupled to a first integrated circuit chip or a first area of an integrated circuit chip. In some embodiments the second optical transceiver array is electrically coupled to a second integrated circuit chip or a second area of the integrated circuit chip. In some embodiments the first integrated circuit chip and drivers for microLEDs of the first optical transceiver array are mounted to a common substrate. In some embodiments the second integrated circuit chip and drivers for the microLEDs of the second optical transceiver array are mounted to a common substrate. In some embodiments, and as illustrated in FIG. 1, a first optical coupling assembly 115a couples light between the first optical transceiver array and the propagation medium, and a second optical coupling assembly 115b couples light between the propagation medium and the second optical transceiver array.

In some embodiments, the first optical transceiver array comprises only optical transmitters and the second transceiver array comprises only optical receivers. In some embodiments, each transceiver array comprises both optical transmitters and receivers, in many such embodiments equal numbers of optical transmitters and receivers. In some embodiments, one or both optical coupling assemblies are omitted so that one or both transceiver arrays are butt-coupled to the optical propagation medium.

Figure 2:
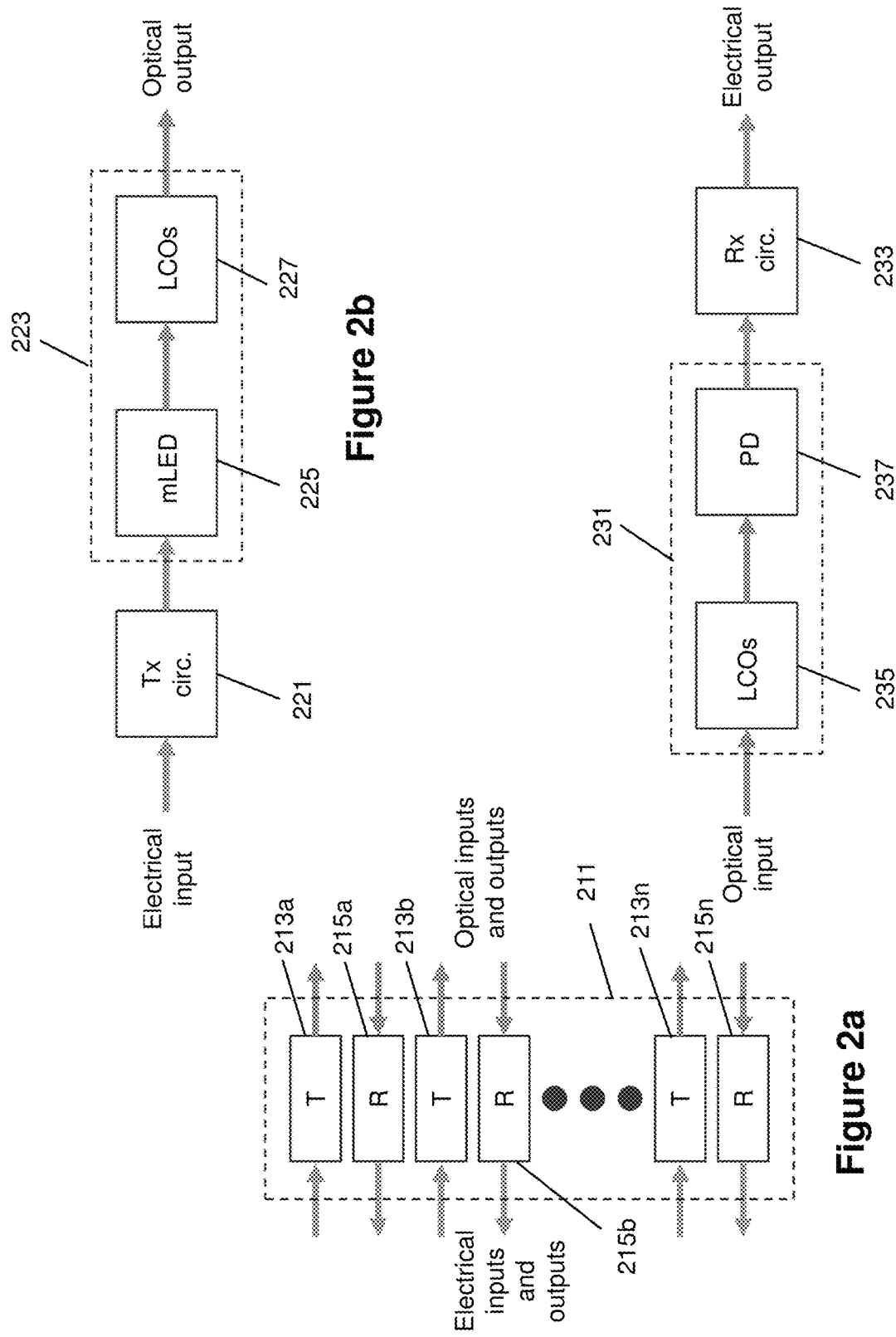
FIG. 2a is a block diagram of an example optical transceiver array in accordance with aspects of the invention.
FIG. 2b is a block diagram of an example optical transmitter in accordance with aspects of the invention.
FIG. 2c is a block diagram of an example optical receiver in accordance with aspects of the invention.

FIG. 2a is a block diagram of an example optical transceiver array 211. The optical transceiver array of FIG. 2a includes a plurality of optical transmitters 213a-n and a plurality of optical receivers 215a-n. The optical transmitters receive electrical signals and generate light signals encoding data of the electrical signals. The optical receivers receive light signals and generate electrical signals encoding data of the light signals. An optical interconnect channel comprises an optical transmitter in one transceiver array that is optically connected to an optical receiver in the other transceiver array.

In some embodiments, an optical transceiver array comprises a 1-dimensional (1D) array. In some embodiments, an optical transceiver array comprises a 2-dimensional (2D) array. In some embodiments, elements of a 2D optical transceiver array are arranged on a square or rectangular grid. In some embodiments, the elements of a 2D optical transceiver array are arranged on a hexagonal close-packed grid.

FIG. 2b is a block diagram of an example optical transmitter. In some embodiments the optical transmitter (Tx) is provided for each channel of an optical interconnect, which may be a parallel optical interconnect. The optical transmitter of FIG. 2b comprises transmitter circuitry 221 and a microLED optical assembly (MOA) 223. The MOA comprises a microLED 225 and transmitter light collection optics (TLCOs) 227 that collect the light emitted by the microLED to improve optical coupling efficiency to the rest of the optical interconnect. The output of the Tx circuitry is connected to the electrical input of the microLED. The Tx circuitry drives the microLED at current and voltage levels that generate desired optical output signals. The Tx circuitry may also comprise emphasis/equalization circuits, digital control and/or monitoring circuits.

In some embodiments, the microLED is made from GaN, where the active emitting region of the microLED comprises one or more InGaN quantum wells. In some embodiments the microLED emits light at wavelengths less than 500 nm, and in some embodiments at wavelengths less than 450 nm. In some embodiments, the light collection optics preferentially cause light to propagate in a direction normal to the microLED surface. In some embodiments, the TLCOs preferentially cause light to propagate in a direction parallel to the microLED surface.

FIG. 2c is a block diagram of an example optical receiver. In some embodiments the optical receiver (Rx) is provided for each channel of an optical interconnect, which may be a parallel optical interconnect. The optical receiver (Rx) of FIG. 2c comprises a photodetector optical assembly (POA) 231 and receiver circuitry 233. The POA comprises receiver light collection optics (RLCOs) 235 and a photodetector (PD) 237, which may be a photodiode. The RLCOs enable input light from the optical system, for example the propagation medium of FIG. 1, to be more efficiently coupled to the photodetector (PD). An electrical output of the PD is connected to the input of the receiver circuitry. The Rx circuitry may comprise a transimpedance amplifier (TIA) followed by other circuits that may amplify the signal to logic levels and/or allow subsequent loads to be driven. The Rx circuitry may also comprise equalization, digital control and/or monitoring circuits.

In some embodiments the photodetector is a silicon photodetector. Silicon PDs are particularly advantageous for use in optical links using microLEDs made from GaN and emitting light at wavelengths of less than 500 nm. In particular, for wavelengths of less than 450 nm, the absorption length in a silicon photodetector is a few tenths of a micron. This allows fabrication of simple PD structures that are compatible with standard CMOS fabrication processes. In some embodiments of a PMI receiver, a silicon PD is monolithically integrated with receiver circuitry.

This may enable very compact, inexpensive, high-performance receiver implementations. In some embodiments, the RLCOs preferentially collect light incident in a direction normal to the PD surface. In some embodiments, the RLCOs preferentially collect light incident in a direction parallel to the PD surface.

Parallel PD Interconnect Hierarchy

Figure 3:
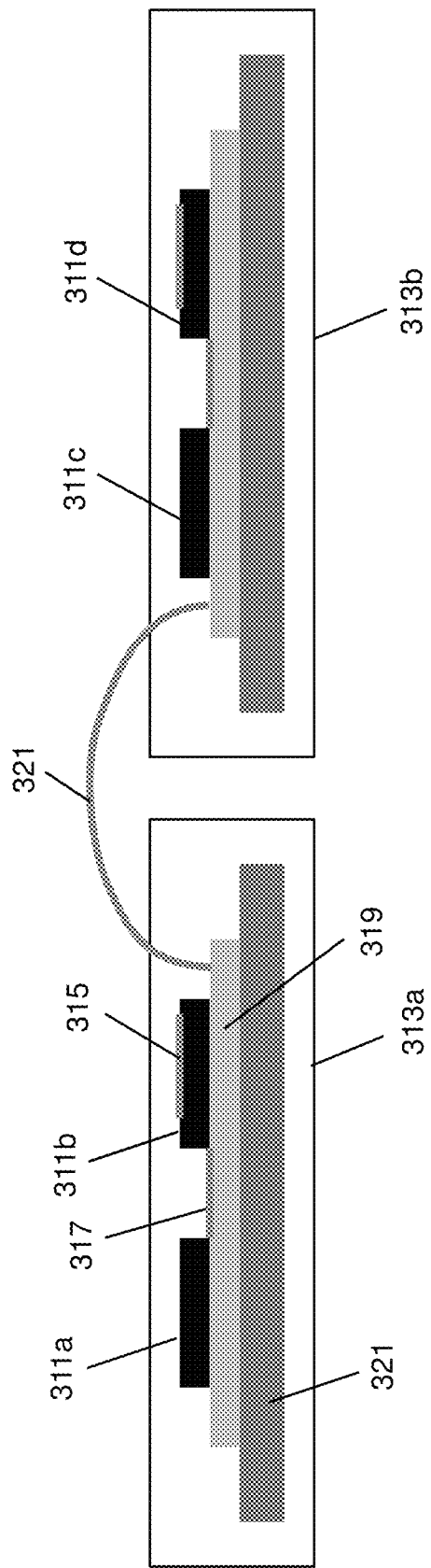
FIG. 3 illustrates in semi-block diagram form a pair of multi-chip modules, with intra-chip optical interconnects, inter-chip intra-module optical interconnects, and inter-module optical interconnects, in accordance with aspects of the invention.

FIG. 3 illustrates in semi-block diagram form a pair of multi-chip modules, with intra-chip optical interconnects, inter-chip intra-module optical interconnects, and inter-module optical interconnects. The optical interconnects may be, for example, as discussed with respect to FIG. 1 and/or FIGS. 2a-c. A parallel microLED optical interconnect therefore can be used at various interconnect levels.

In the example of FIG. 3, a first pair of integrated circuit chips 311a,b are in a first multi-chip module 313a, and a second pair of integrated circuit chips 311c,d are in a second multi-chip module 313b. In some embodiments a PMI connects between different areas on the same integrated circuit (IC), e.g. an "intra-IC interconnect," for example as illustrated by a PMI 315 on the IC chip 311b. Such interconnects can serve as "express lanes," greatly reducing latency compared to an on-chip electronic interconnect, which may require tens of electrical regenerators such as flip-flops (and thus tens of clock cycles of latency) to traverse a large IC. Thousands of these intra-chip optical interconnects may be used on a single IC.

In some embodiments, a PMI connects between two ICs that are within the same multi-chip module (MCM), e.g., an "inter-IC interconnect." Such is illustrated, for example, by a PMI 317 connecting IC chips 311a,b. In FIG. 3, the PMI 317 is shown as being on an interposer 319, which the IC chips 311a,b are on. In some embodiments, however, the propagation medium of the PMI may pass through the interposer. In addition, in some embodiments the multi-chip module 313a may not include an interposer, with for example the IC chips 311a,b being on a package substrate (shown as below the interposer in FIG. 3.) In such embodiments, the propagation medium may be on or in the package substrate. While only a single inter-IC interconnect PMI is explicitly shown in FIG. 3, in various embodiments each pair of IC chips may be connected by many thousands of optical interconnects.

In some embodiments, a PMI connects between two different modules, e.g. an "inter-module interconnect," for example by a PMI 321 connecting the multi-chip modules 313a,b. In some embodiments the modules comprise multiple chips in a common package. In some embodiments the multiple chips in a common package comprise a multi-chip module. Modules may be connected by many thousands or even millions of optical interconnects. In some embodiments the optical propagation medium, for the intra-module interconnect, is, at least in part, part of an interposer or substrate or package for the module.

Unlike electronic interconnects, the loss of optical interconnects is approximately independent of distance up to 10 cm for more; low-loss waveguides and fibers may have small losses over distances of several meters. This allows modules containing inter-IC optical interconnects to be quite large. The roughly distance-independent loss of the optical interconnects allows, in some embodiments, large numbers of modules (each of which can be quite large) to be interconnected in a flexible manner, supporting system optimization for modularity, manufacturability, serviceability, and thermal and mechanical issues.

In some embodiments, a PMI connects between two different shelves that are within the same rack. Such connections are typically less than 2 meters long. In some embodiments, a PMI connects between two shelves that are in different racks. Such connects are frequently less than 5 meters long if the racks are adjacent or in close proximity. For these inter-shelf and inter-rack connections, a PMI provides significantly lower power dissipation and higher interconnect density compared to other electrical or optical interconnect implementations.

Vertical Tx Coupling Configurations

There are numerous possible embodiments of a microLED optical assembly (MOA) optimized for launching light normal to a light-emitting surface of a microLED that is part of the MOA. In some embodiments, the microLED is butt-coupled to the endface of a waveguide or to the endface of the core of a multicore fiber. In some embodiments, the microLED is mounted to a substrate on which transmitter light collection optics (TLCOs) are also mounted. In some embodiments, for example as illustrated in the cross-section of FIG. 4a, a microLED 411 is on a surface of a substrate 413, and the TLCOs comprise a lens 415 formed from some optically transparent encapsulant 416 on the substrate and microLED that effectively encapsulates the microLED. Encasing the microLED in a transparent encapsulant can increase the light extraction efficiency (LEE) from the microLED by reducing the amount of total internal reflection (TIR) within the microLED.

Figure 4B:
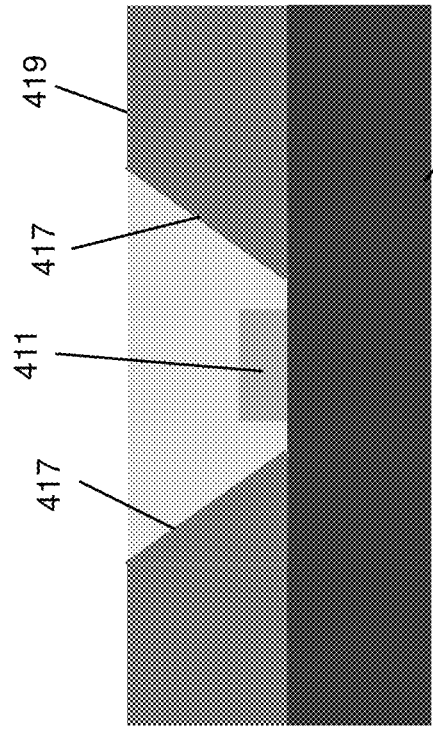
FIGS. 4a-c are cross-sections of microLED optical assemblies illustrating vertical optical transmission coupling configurations, in accordance with aspects of the invention.

In some embodiments, the TLCOs comprise a reflector structure. The reflector structure may comprise a structure with a sloping surface that is made to be highly reflective, for instance by deposition of a highly reflective metal such as aluminum. For example, the cross-section of FIG. 4b shows a microLED 411 on a substrate 413. Reflective surfaces 417 slope away from the microLED with increasing distance from the substrate. In FIG. 4b, the microLED is shown as being in a gap of a dielectric layer 419 on the substrate, with the gap increasing in width with distance from the substrate. The reflective surfaces on the dielectric layer, and the gap may be filled with encapsulant 416 to encapsulate the microLED. The reflector structure is effective in collecting light that is propagating at large angles relative to the microLED surface normal. In some embodiments, the reflector surface is part of a cone of revolution such that a 2D projection is a line. In some embodiments, the reflector surface is part of a parabola of revolution such that a 2D projection is a parabola. In some embodiments, the reflector structure is fabricated by depositing a layer of a dielectric material and then selectively etching away the dielectric to define the surfaces of the reflector. In some embodiments, the cavity that defines the reflector structure is filled in with an encapsulant that covers the microLED.

Figure 4C:
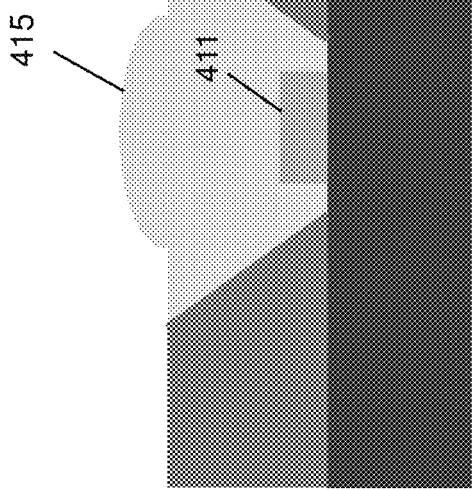
Figure 4A:
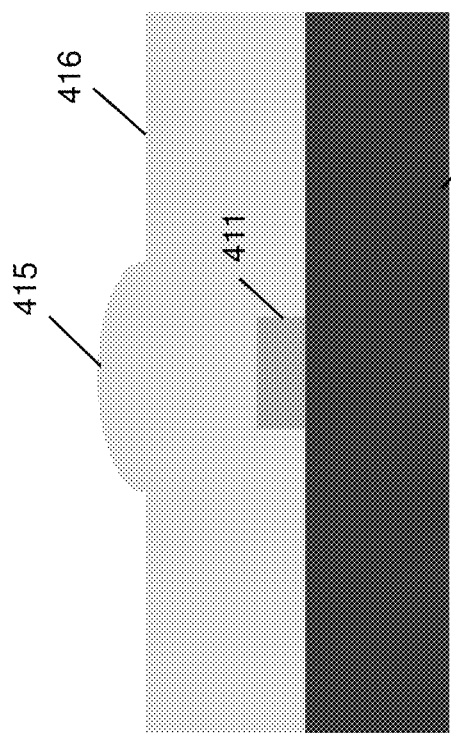

In further embodiments, for example as illustrated in the cross-section of FIG. 4c, for the structure of FIG. 4b, a lens 415 may formed at the top of the encapsulant layer 416 filling the reflector cavity such that the collection optics comprise both a reflector and a lens.

Vertical Rx Coupling Configurations

There are numerous possible embodiments of a POA optimized for receiving light normal to a photodetector (PD) surface. An assembly comprising a PD and RLCOs that is optimized for preferentially collecting light incident in a direction normal to the PD surface can be realized in numerous ways. In some embodiments, receiver light collection optics (RLCOs) are fabricated on the same substrate in which the PD is fabricated.

Figure 5A:
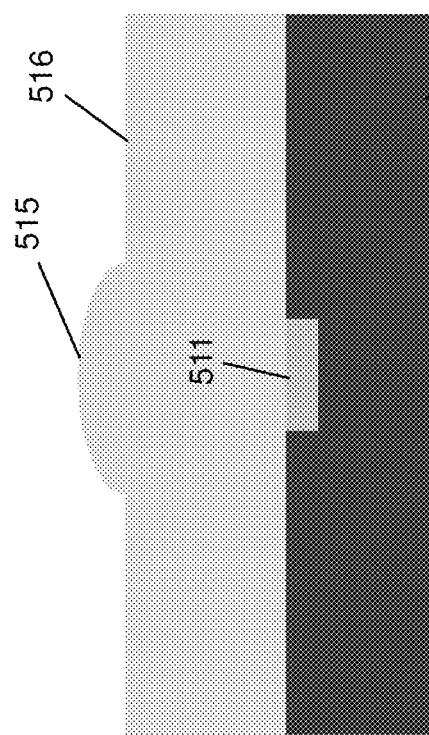
FIGS. 5a-c are cross-sections of photodetector optical assemblies illustrating vertical optical transmission coupling configurations, in accordance with aspects of the invention.

In some embodiments, the RLCOs comprise a lens (FIG. 5a) formed from some optically transparent encapsulant that encapsulates the PD. In some embodiments, for example as illustrated in the cross-section of FIG. 5a, a photodetector 511 is on a surface of a substrate 513, and a RLCOs comprise a lens 515 formed from some optically transparent encapsulant 516 on the substrate and PD that effectively encapsulates the PD. Encasing the PD in a transparent encapsulant can decrease optical reflections at the PD surface, improving overall PD quantum efficiency.

In some embodiments, the RLCOs comprise a reflector structure. The reflector structure may comprise a structure with a sloping surface that is made to be highly reflective, for instance by deposition of a highly reflective metal such as aluminum. For example, the cross-section of FIG. 5b shows a PD 511 on a substrate 513. Reflective surfaces 517 slope away from the PD with increasing distance from the substrate. In FIG. 5b, the PD is shown as being in a gap of a dielectric layer 519 on the substrate, with the gap increasing in width with distance from the substrate. The reflective surfaces on the dielectric layer, and the gap may be filled with encapsulant 516 to encapsulate the PD. The reflector structure is effective in collecting light that is propagating at large angles relative to the PD surface normal. In some embodiments, the reflector surface is part of a cone of revolution such that a 2D projection is a line. In some embodiments, the reflector surface is part of a parabola of revolution such that a 2D projection is a parabola. In some embodiments, the reflector structure is fabricated by depositing a layer of a dielectric material and then selectively etching away the dielectric to define the surfaces of the reflector. In some embodiments, the cavity that defines the reflector structure is filled in with an encapsulant that covers the PD.

Figure 5C:
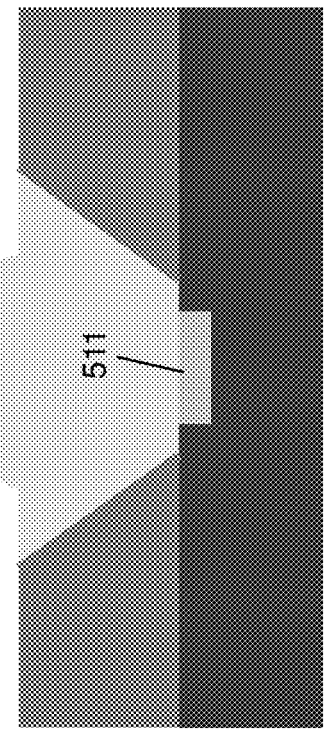
Figure 5B:
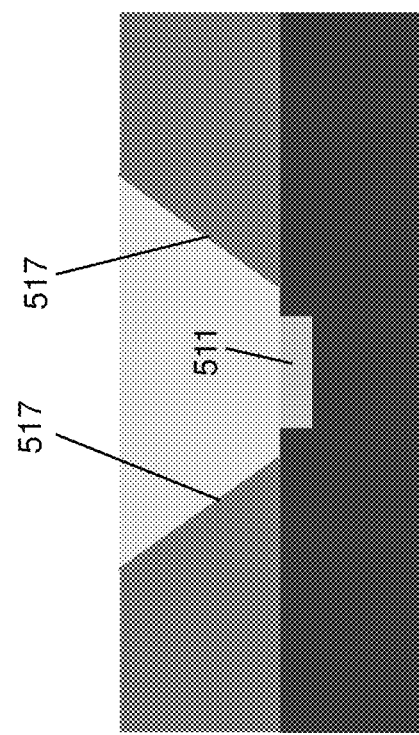

In further embodiments, for example as illustrated in the cross-section of FIG. 5c, for the structure of FIG. 5b, a lens 515 may formed at the top of the encapsulant layer 516 filling the reflector cavity such that the collection optics comprise both a reflector and a lens.

Planar Tx Coupling Configurations

FIGS. 6a-c and FIGS. 7a-c show various embodiments for coupling one microLED optical assembly (MOA) to one waveguide. In some embodiments the MOA comprises an edge-emitting microLED. In some embodiments the MOA comprises a surface emitting microLED. In some embodiments, and as illustrated in FIG. 6a, a MOA 611 is positioned such that light from the MOA is coupled to an endface of a waveguide 613. In FIG. 6a (and FIGS. 6b,c) the waveguide is shown as having a waveguide core 615 longitudinally bounded by waveguide cladding 617. The waveguide may be single-mode or multimode at the microLED's wavelength, though given the spatial incoherence of a LED, the optical loss will generally be much lower if a multimode waveguide is used.

In some embodiments, for example as shown in FIGS. 6b and 6c, the MOA 611 is positioned to emit light perpendicular to a propagation axis of the waveguide 613, with light from the MOA coupled to a turning mirror 619 oriented approximately 45° relative to the waveguide's propagation axis. In some embodiments, this turning mirror is a reflecting surface oriented approximately 45° relative to the waveguide's propagation axis. In the embodiment of FIG. 6b, for example, the turning mirror is part of a notch 621 in a waveguide. In some embodiments, for example as shown in FIG. 6c, the turning mirror is a reflecting surface oriented approximately 45° relative to the waveguide's propagation axis at a waveguide core-cladding boundary. Such a turning mirror can be fabricated, for instance, by etching away the waveguide core at the desired 45° angle, then depositing a reflective surface and depositing cladding material.

Figure 7A:
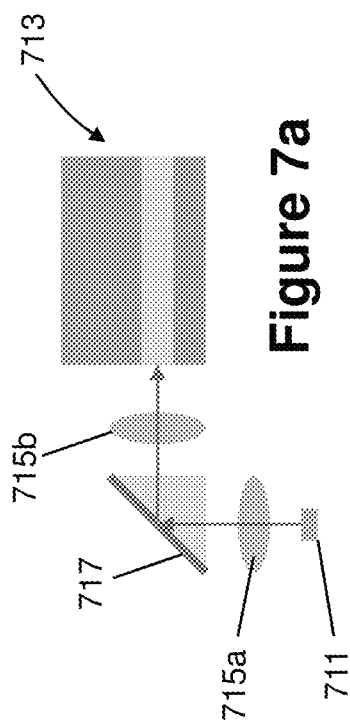
FIGS. 7a-c show various further embodiments for coupling one microLED optical assembly (MOA) to one waveguide, in accordance with aspects of the invention.

In some embodiments, for example as illustrated in FIG. 7a, an MOA 711 is coupled to a waveguide 713 with an optical assembly comprising two lenses 715a,b separated by a turning mirror 717. The lens system is designed such that light from the MOA is imaged onto the waveguide endface. The turning mirror, which may be a right-angle beam-turning mirror, is inserted between the two lenses, allowing light emitting vertically from the MOA to be coupled to a horizontal waveguide. This may be very useful in typical semiconductor packaging scenarios where the MOA are horizontally mounted and emit vertically. In some embodiments this arrangement may provide several advantages: (1) a relatively large gap between the lenses enables the insertion of additional optical elements such as the turning mirror shown; (2) if the first lens is rigidly attached to the microLED assembly while the other is rigidly attached to the waveguide assembly, this arrangement may significantly increase the tolerance to lateral translation of the LED and waveguide assemblies relative to each other, enabling much larger positioning tolerances during assembly and operation.

Figure 7C:
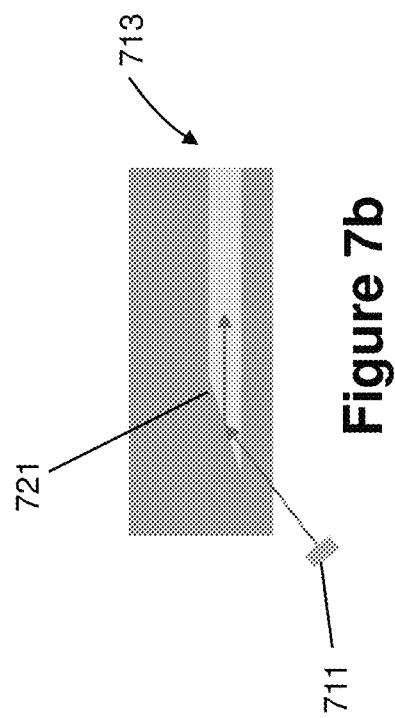
Figure 7B:
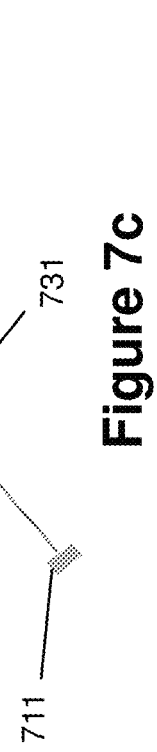

In some embodiments, for example as illustrated in FIG. 7b, a total internal reflection (TIR) mirror 721 is used to couple light from a MOA 711 into a waveguide 713. The TIR mirror shown in FIG. 7b is provided by an angled waveguide core/cladding boundary. In TIR, light propagating in a higher refractive index medium is incident on a boundary of a lower index medium. If the light is incident on the boundary at an angle (measured from the surface normal) larger than a certain critical angle, the light may be 100% reflected at the boundary back into the higher index medium; the critical angle decreases as the index step between the higher index and lower index media increases.

In some embodiments, for example as shown in FIG. 7c, a longitudinal grating 731 is located at the core/cladding boundary of an optical waveguide 713. The longitudinal grating can be used to couple light from a MOA 711 into a waveguide. The achievable coupling efficiency depends on matching the sum of the "momentum" (i.e. wave vector) of the input light and grating to the momentum of the output light. This technique is generally best suited to single spatial-mode sources and single-mode waveguides so the achievable coupling efficiency with microLEDs and multimode waveguides may be limited.

Planar Rx Coupling Configurations

Various configurations support coupling light propagating in a waveguide 813 on a planar substrate 815 into a PD 811 mounted to, or fabricated in, that same planar substrate. In some embodiments, a "waveguide PD" is monolithically integrated with a waveguide, for example as illustrated in FIG. 8a. For instance, if the bandgap in the waveguide region is larger than the photon energy while the bandgap of the PD region is smaller than the photon energy, then the light will propagate in the waveguide with relatively low attenuation while being highly absorbed and converted to current in the PD region. In some embodiments, a waveguide PD is fabricated by removing and epitaxially regrowing semiconductor material in the PD region.

In some embodiments, a waveguide 813 on a planar substrate 815 is butt-coupled to a PD 811 capable of detecting light incident on its side, where the PD is mounted to that same planar substrate, for example as illustrated in FIG. 8b. In some embodiments, a substrate 815 on which the waveguide 813 is positioned contains a PD 811, as illustrated in FIG. 8c. In such embodiments the bottom cladding of the waveguide may be removed where the waveguide runs over the PD area so that the waveguide core is in contact with the PD, causing light to be absorbed by the PD as the light propagates through the region where the waveguide core is in contact with the PD. In some embodiments, receiver circuitry (not shown in FIG. 8c) may be monolithically integrated with the PD in the substrate. This arrangement enables relatively simple fabrication and low parasitic capacitance associated with the PD-receiver circuitry connection.

In some embodiments, and as illustrated in FIG. 8d, a turning mirror 821 is positioned at an end of a waveguide 813. The turning mirror causes light to be reflected onto a photodetector 811 that is integrated into a substrate 815 on which the waveguide is positioned or fabricated. In some embodiments, the turning mirror is metalized to enhance its reflectivity. This arrangement allows the light in the waveguide to be collected by a relatively small PD with dimensions on the order of the cross-sectional dimensions of the waveguide. In some embodiments, receiver circuitry (not shown in FIG. 8d) is monolithically integrated with the PD in the substrate. This arrangement enables low parasitic capacitance associated with the PD-receiver circuitry connection.

Duplex Connections

Duplex optical waveguide links exploit light propagating in both directions through a waveguide to implement a bidirectional link using a single waveguide. A duplex connection in a single-mode waveguide generally must utilize elaborate measures such as different wavelengths or circulators to achieve low loss, high fidelity connections. FIGS. 9a-c illustrate duplex optical assemblies for use in optical links, which in many embodiments are multimode duplex optical links or connections. In some embodiments the multimode duplex connections exploit the increase in etendue between a microLED-based transmitter and the etendue at the receiver to implement simple, practical duplex links.

In a set of embodiments of a duplex transceiver, a microLED 911 is mounted to a substrate 913 in which a photodetector (PD) 915 is fabricated. In some embodiments of a duplex transceiver, the microLED is placed on top of the PD, as illustrated in FIG. 9a. In FIG. 9a, microLED is wholly over the PD. The PD, however, includes a detection surface with a larger area than that of the microLED, such that the microLED only covers a portion of the PD detection area and the PD may receive light on portions of the surface not covered by the microLED. In some embodiments, however, the microLED may partially cover the PD and partially cover the substrate. In some embodiments electrical connections from transceiver circuitry to the microLED may be made over the top surface of the photodetector. In some embodiments, the PD is fabricated in a silicon substrate that also contains transmitter and receiver circuitry.

The light from the microLED can be efficiently coupled into a waveguide, for example a multimode waveguide, via various optical coupling schemes. In some embodiments the optical coupling schemes may be as those discussed above for microLED optical assemblies. In some embodiments the optical coupling schemes may include one or more lenses and/or reflecting optical collector(s). Light propagating in the waveguide toward the duplex transceiver can be efficiently coupled to the larger photodetector, for example using the same optical coupling schemes or other lens(es) and/or reflecting optical collector(s). Received light impinging on the microLED will not be received by the photodetector and therefore contribute to link loss. However, if the LED area is small compared to the photodetector area and the light is well-distributed across the photodetector, this loss contribution will be small. For instance, if the microLED is 2 um×2 um and the photodetector is 6 um×6 um, with the light uniformly distributed across the photodetector, this will cause a loss of $10*\log 10((6\times6-2\times2)/(6\times6))=0.5$ dB.

In some embodiments of a duplex transceiver, a microLED 911 is mounted on a substrate 913 next to a PD 915, which may be a larger PD (FIG. 9b). In some embodiments, for example as illustrated in FIG. 9b. FIG. 9c illustrates an embodiment of a duplex transceiver in which a microLED 911 is mounted to a substrate, with a PD 915 surrounding the microLED. In some such embodiments, for example, the PD may be annular in shape.

In some embodiments, the duplex microLED/PD embodiments can be substituted for by the microLED-only or PD-only embodiments shown in FIGS. 4-8 and/or discussed in this disclosure.

Propagation Media

As noted elsewhere in this disclosure, a propagation medium provides connectivity between the two transceiver arrays in a parallel microLED interconnect (PMI). In some embodiments, the propagation medium comprises a waveguide array. In some embodiments, the waveguide array comprises one or more layers of waveguides fabricated on a planar substrate. The waveguides may be fabricated from materials such as SiO2, SiN, and SiON waveguide arrays. These waveguide arrays are typically fabricated using planar semiconductor techniques such as planar deposition, photolithography, etching, and dopant diffusion. The planar substrate may be made a rigid material such as silicon or glass. Alternatively, the substrate may be made from a flexible material such as a polymer.

In some embodiments, the waveguide array comprises a fiber with multiple cores. In some embodiments, the cores may be designed such that each core carries a single optical channel associated with a PMI. In some embodiments, the number of these cores is between 32 and 1024.

In some set of embodiments of a PMI, the light from each optical channel is carried in multiple cores. In some embodiments, the fiber may comprise a bundle of more than 1000 cores, where the positions of the cores relative to each other are maintained along the fiber length; this is known as a coherent fiber bundle (CFB). In some embodiments, the CFB cores are arranged in a square or rectangular grid. In some embodiments, the cores are arranged in a hexagonal close-packed grid. In some CFB embodiments, the diameter of each core is less than 10 um.

Array Coupling

In some embodiments, a transceiver array 1011 is butt-coupled to a propagation medium 1013, for example as illustrated in FIG. 10a. The propagation medium may be a waveguide array. In some embodiments, a lens assembly 1015 is used to image each element of the transceiver array onto an input of the propagation medium, for example as illustrated in FIG. 10b. The use of a lens assembly can improve optical coupling efficiency and packaging flexibility compared to a butt-coupled arrangement. The lens assembly may comprise a single optical element or may comprise numerous optical elements. In some embodiments, the lens assembly is telecentric. In some embodiments, the imaging magnification is approximately one. In some embodiments, the imaging magnification is greater than one. In some embodiments, the imaging magnification is less than one.

Figure 11:
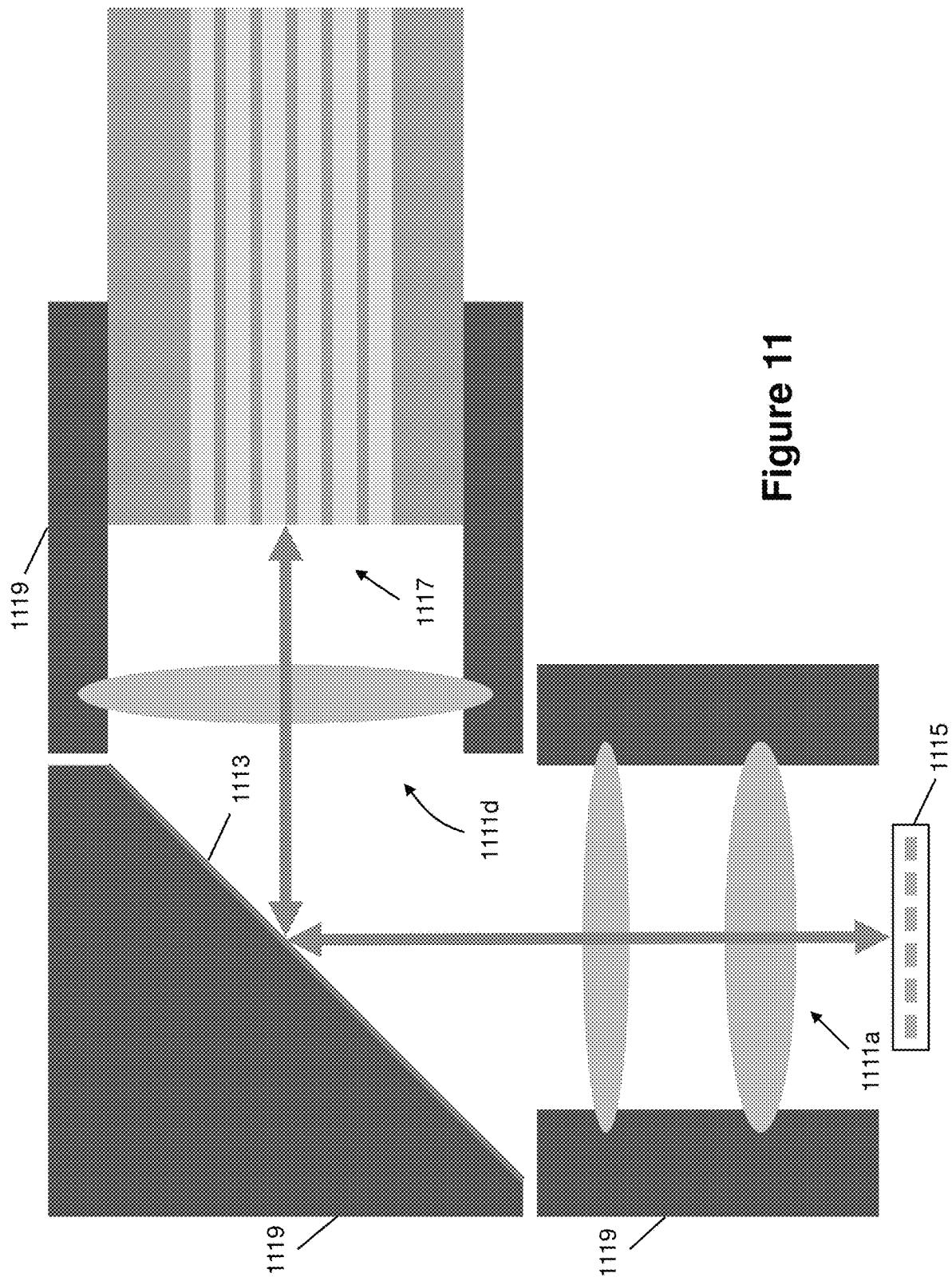
FIG. 11 illustrates an example optical coupling mechanism for an optical transceiver array, in accordance with aspects of the invention.

In some embodiments, for example as illustrated in FIG. 11, an optical coupling assembly comprises two lens assemblies 1111a,b with a turning mirror 1113 between them, is placed between a transceiver array 1115 and an input of an optical propagation medium 1117. This arrangement may provide several advantages: (1) additional optical elements, such as the turning mirror shown, can be inserted into the gap between the lens assemblies; (2) if the first lens is rigidly attached to the transceiver array while the other is rigidly attached to the waveguide array, lateral translational tolerances are significantly increased relative to a butt-coupled arrangement; (3) optical coupling efficiency may be increased; (4) the optical coupling assemblies can provide magnification or demagnification, for instance by using two lens assemblies with different focal lengths. This provides extra flexibility in design of the various components (e.g. transmitters, receivers, propagation medium channels) and packaging.

The use of a right-angle turning mirror between the two lens assemblies may be very useful in typical semiconductor packaging scenarios where the various ICs and packages are horizontally mounted. Each lens assembly may comprise a single optical element or may comprise numerous optical elements. In some embodiments, the lens assemblies are telecentric. In some embodiments, the imaging magnification of the optical coupling assembly is approximately one. In some embodiments, the imaging magnification of the optical coupling assembly is greater than one. In some embodiments, the imaging magnification of the optical coupling assembly is less than one.

In some embodiments, and as diagrammatically illustrated in FIG. 11, the lens assemblies are positioned using silicon mechanical structures 1119. The silicon mechanical structures may also be used for the turning mirror, with for example on some embodiments a surface of the silicon mechanical structures metalized to provide the turning mirror. In some embodiments, the optical coupling assemblies comprise silicon mechanical structures fabricated using micro-electromechanical systems (MEMS) techniques. Fabrication techniques such as deep reactive ion etching (DRIE) may be used to fabricate cavities hundreds of microns deep with very high aspect ratios; such features are well-suited to holding lenses and other optical elements. In some embodiments, the optical elements of these assemblies are polymer lenses fabricated using molding, etching, or 3D printing techniques. In some embodiments, turning mirrors are fabricated by precisely controlling the silicon etching angle, for instance by using highly anisotropic etchants and silicon wafers with the appropriate crystal orientation.

Free-Space Propagation Approaches

Figure 12:
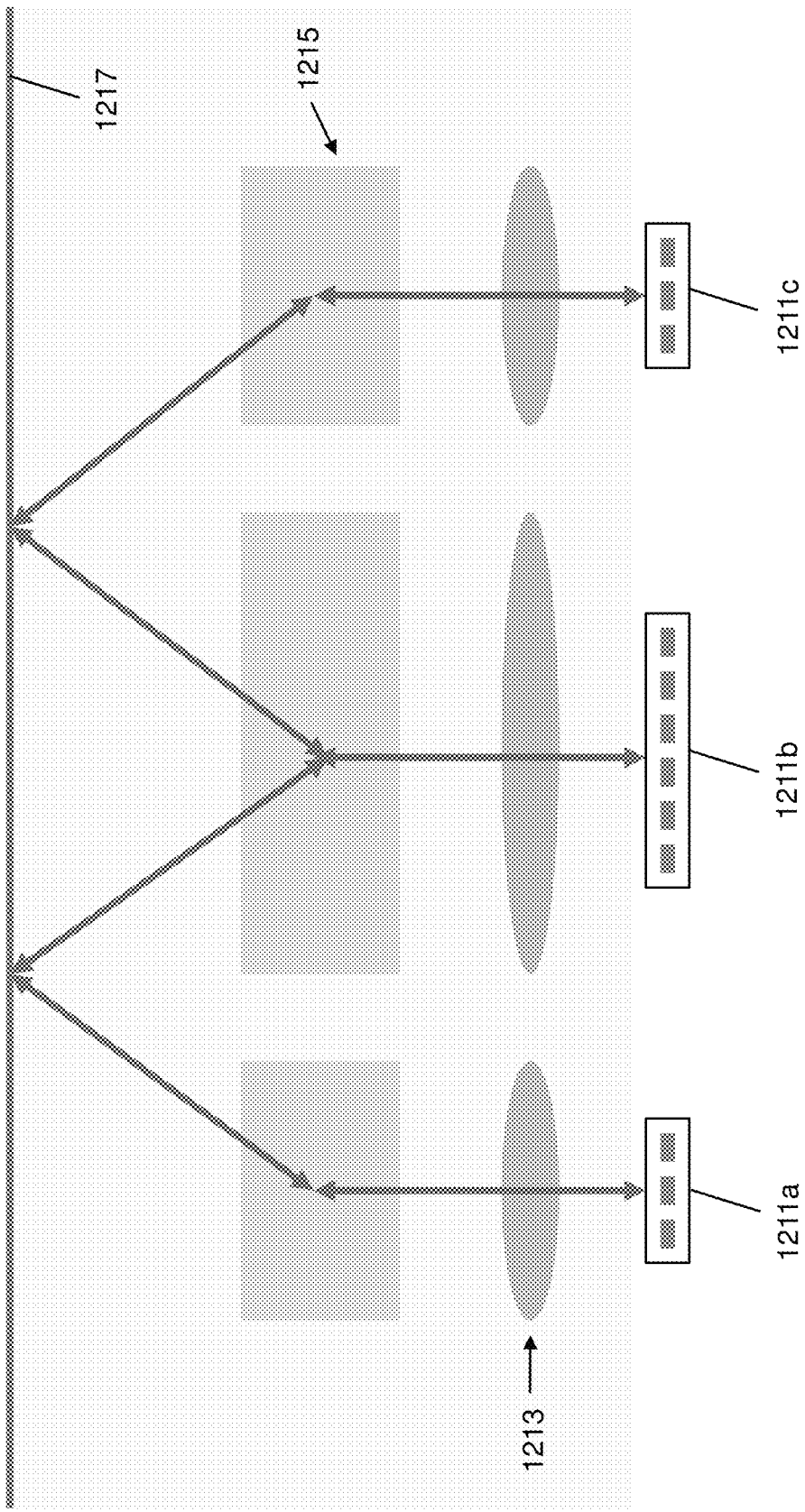
FIG. 12 illustrates a free space optical coupling scheme, in accordance with aspects of the invention.

The use of a free-space propagation medium provides extra degrees of flexibility for transporting light between transceiver arrays 1211a-c. In some embodiments, one or more lenses 1213 are used to relay data from parallel optical channels between the input/output (I/O) arrays of the propagation medium, as shown in FIG. 12. The example of FIG. 12 is just one embodiment of such an approach, and a rich variety of embodiments are possible by using more, fewer, or different optical elements than those in the figure. In FIG. 12, holographic optical elements (HOEs) 1215 are used to flexibly set the connectivity between I/O arrays of the propagation medium. For instance, HOEs can be used to send the light from various channels in one transceiver array to different transceiver arrays associated with other ICs, which may be considered to provide an architecture supporting flexible connections between more than two ICs. A mirror 1217 can be used to "fold" the optical beam, making the system more compact and allowing all ICs to lie in a single array.

Bus Connections

Some embodiments provide bus structures with optical interconnects. The asymmetry between the distribution of the light from the LED and the light incident on the photodetector (for example discussed in duplex connections section above) allows for the implementation of efficient buses where 100% of the light can be launched from an LED into a waveguide but only a fraction of the light can be tapped by a receiver.

FIG. 13a shows a generic master-slave bus with a duplex connection to each of a series of nodes, each comprising an optical Tx and Rx. A bus "master" node 1311 comprises a Tx and Rx and can communicate bidirectionally with every "slave" node 1313a-n by way of optical couplers 1315 and a propagation medium 1317. Each slave node can communicate bidirectionally with the bus master node but cannot communicate directly with other slave nodes. This arrangement is useful, for example, for communication between a processor at the master node and multiple memories at the slave nodes.

In some embodiments of a parallel optical bus, a master node is located at one end of an optical waveguide array. A transmitter array and receiver array are coupled to the optical waveguides as discussed elsewhere herein, for example as discussed with respect to simple point-to-point optical links. At each slave node, some fraction of the light in each waveguide is tapped out and relayed to a photodetector that is part of an optical receiver. All of the light from each slave node Tx can be coupled into its associated waveguide.

As illustrated in FIGS. 13b and 13c, the master node and each slave node may include a microLED 1321 and a photodetector 1323, which may be a photodiode in some embodiments. In some embodiments the master node may include a lens 1325 for use in coupling light into or out of the propagation medium, although in various embodiments the lens may be considered to be part of the optical coupler.

In some embodiments of a parallel optical bus, light is coupled between the master node and the waveguide array using a turning mirror 1327 in each waveguide 1331. At other locations along the length of the bus, there is a turning mirror 1329 in each waveguide that subtends only part of the waveguide cross-section. This allows tapping out only a fraction of the light propagating to the right (as illustrated in FIGS. 12b,c) in the waveguide at each slave node location, which enables multiple receiving taps along the bus. By contrast, it is generally desirable to couple all of the light from each slave node Tx into its associated waveguide.

In some embodiments, turning mirrors may be fabricated by fabricating a reflective end surface at 45° to the waveguide surface. In some embodiments, the 45° mirror surfaces are made reflective by metalizing the surface with a highly reflective metal such as aluminum. In some embodiments, the 45° surface is created by fabricating a notch into the waveguide FIG. 12b.

FIG. 13c illustrates an embodiment of an optical bus comprised of sections of waveguide arrays 1331a-n that are separated by node assemblies 1337a-n. Each node assembly comprises two lens assemblies 1341 separated by a right-angle turning mirror 1343. At the master node, a right angle turning mirror 1327 subtends the entire cross-section of each waveguide. At each slave node, the turning mirror subtends only a part of the expanded beam that transits between the two lens assemblies. By subtending only a fraction of the beam, a fraction of the light in each waveguide can be tapped and sent to the Rx for that node. However, 100% of the light from the Tx array at each node can be launched into the waveguides. This asymmetry in Rx and Tx coupling is possible because the light in each channel is highly spatially multimode.

Optimizing the LED Driver for Speed

The use of microLEDs in fast optical links (>1 Gbps) has typically been inhibited by LED operational speeds. As opposed to semiconductor lasers operated well above threshold where recombination is dominated by stimulated emission, the speed of LEDs is generally or often limited by the relatively slow carrier recombination lifetime.

There are ways to increase the maximum bit rate $B_{max}$ that can be supported by directly modulated microLED by optimizing the microLED drive waveform. In some embodiments, to turn the microLED "on" with minimum rise time, the microLED is driven with a very fast current impulse (impulse width$<<1/B_{max}$), ideally approaching a Dirac delta, as illustrated in FIG. 14, which provides a graphs of drive waveform and light output vs. time. As illustrated in FIG. 14, the fast current impulse results in a rapid increase of light output from the microLED.

In some embodiments, to turn the microLED "off" with minimum fall time, a negative bias voltage is applied to the LED, which sucks the remaining carriers out of the LED and extinguishes the output. The speed of these "on" and "off" signals is generally limited by the resistance-capacitance product (RC) of the microLED driver and microLED.

Although the invention has been discussed with respect to various embodiments, it should be recognized that the invention comprises the novel and non-obvious claims supported by this disclosure.

What is claimed is:

1. An inter chip optical communication system, comprising:
    a waveguide having a waveguide core bounded by waveguide cladding between a first endface and a second endface;
    a first photodetector electrically coupled to a first integrated circuit chip and optically coupled to the first endface of the waveguide; and
    a first microLED on a portion of the first photodetector, the first microLED electrically coupled to the first integrated circuit chip and optically coupled to the first endface of the waveguide, with an area of the first microLED small compared to an area of the first photodetector;
    a second photodetector electrically coupled to a second integrated circuit chip and optically coupled to the second endface of the waveguide; and
    a second microLED on a portion of the second photodetector, the second microLED electrically coupled to the second integrated circuit chip and optically coupled to the second endface of the waveguide, with an area of the second microLED small compared to an area of the second photodetector;
    wherein the first integrated circuit chip and the second integrated circuit chip are part of a bus connection, the first microLED and the first photodetector making up a master node and the second microLED and the second photodetector making up a slave node.

2. The system of claim 1, wherein the first integrated circuit chip, the first photodiode, and the first microLED are in a first package, and the second integrated circuit chip, the second photodiode, and the second microLED are in a second package.

3. The system of claim 1, wherein the first photodetector and the second photodetector are made of silicon.

4. The system of claim 3, wherein the first photodetector is monolithically integrated into the first integrated circuit chip, and the second photodetector is monolithically integrated into the second integrated circuit chip.

5. The system of claim 1, wherein the waveguide comprises a multimode waveguide.

6. The system of claim 1, wherein the first microLED and the second microLED are configured to emit light with a wavelength less than 500 nm.

7. The system of claim 1, wherein the first microLED and the second microLED are made from GaN.

8. The system of claim 1, wherein the area of the first microLED is 11% or less than the area of the first photodetector, and wherein the area of the second microLED is 11% or less than the area of the second photodetector.

9. The system of claim 1, wherein the area of the first microLED and the area of the first photodetector is such that, for light uniformly distributed across the first photodetector, a loss of 0.5 dB or less will result due to presence of the first microLED, and wherein the area of the second microLED and the area of the second photodetector is such that, for light uniformly distributed across the second photodetector, a loss of 0.5 dB or less will result due to presence of the second microLED.

10. The system of claim 1, wherein the first microLED is located on a portion of the first integrated circuit chip, and the second microLED is located on a portion of the second integrated circuit chip.

11. The system of claim 1, wherein the first photodetector surrounds the first microLED, and the second photodetector surrounds the second microLED.

* * * * *